(12) United States Patent
Wu et al.

(10) Patent No.: US 12,364,165 B2
(45) Date of Patent: Jul. 15, 2025

(54) METHODS TO IMPROVE MAGNETIC TUNNEL JUNCTION MEMORY CELLS BY TREATING NATIVE OXIDE

(71) Applicant: Taiwan Semiconductor Manufacturing Co., Ltd., Hsinchu (TW)

(72) Inventors: Jung-Tang Wu, Kaohsiung (TW); Meng Yu Wu, Taichung (TW); Szu-Hua Wu, Zhubei (TW); Chin-Szu Lee, Taoyuan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/501,843

(22) Filed: Nov. 3, 2023

(65) Prior Publication Data
US 2024/0065110 A1 Feb. 22, 2024

Related U.S. Application Data

(63) Continuation of application No. 17/240,346, filed on Apr. 26, 2021, now Pat. No. 11,844,283, which is a continuation of application No. 16/177,030, filed on Oct. 31, 2018, now Pat. No. 10,991,876.

(51) Int. Cl.
| | |
|---|---|
| H10N 50/01 | (2023.01) |
| H10B 61/00 | (2023.01) |
| H10N 50/10 | (2023.01) |
| H10N 50/80 | (2023.01) |
| H10N 50/85 | (2023.01) |

(52) U.S. Cl.
CPC ............. *H10N 50/01* (2023.02); *H10B 61/22* (2023.02); *H10N 50/85* (2023.02); *H10N 50/10* (2023.02); *H10N 50/80* (2023.02)

(58) Field of Classification Search
None
See application file for complete search history.

(56) References Cited

U.S. PATENT DOCUMENTS

| | | | |
|---|---|---|---|
| 2017/0358482 A1* | 12/2017 | Chen | ................. H01L 21/76883 |
| 2018/0123029 A1* | 5/2018 | Park | ....................... H10N 50/10 |
| 2018/0205010 A1* | 7/2018 | Park | ...................... H10B 61/22 |
| 2019/0088864 A1 | 3/2019 | Cho et al. | |
| 2019/0157548 A1 | 5/2019 | Wu et al. | |
| 2019/0165258 A1 | 5/2019 | Peng et al. | |
| 2020/0006641 A1 | 1/2020 | Liou et al. | |
| 2020/0075299 A1* | 3/2020 | Wu | ..................... H01J 37/3244 |

\* cited by examiner

*Primary Examiner* — Daniel Whalen
(74) *Attorney, Agent, or Firm* — Slater Matsil, LLP

(57) ABSTRACT

Methods of forming magnetic tunnel junction (MTJ) memory cells used in a magneto-resistive random access memory (MRAM) array are provided. A pre-clean process is performed to remove a metal oxide layer that may form on the top surface of the bottom electrodes of MTJ memory cells during the time the bottom electrode can be exposed to air prior to depositing MTJ layers. The pre-clean processes may include a remote plasma process wherein the metal oxide reacts with hydrogen radicals generated in the remote plasma.

20 Claims, 11 Drawing Sheets

METHODS TO IMPROVE MAGNETIC TUNNEL JUNCTION MEMORY CELLS BY TREATING NATIVE OXIDE

PRIORITY CLAIM AND CROSS-REFERENCE

This application is a continuation of U.S. patent application Ser. No. 17/240,346 filed on Apr. 26, 2021 and entitled "Methods To Improve Magnetic Tunnel Junction Memory Cells By Treating Native Oxide," which is a continuation of U.S. patent application Ser. No. 16/177,030 filed on Oct. 31, 2018 and entitled "Methods To Improve Magnetic Tunnel Junction Memory Cells By Treating Native Oxide," now U.S. Pat. No. 10,991,876, issued on Apr. 27, 2021, which applications are hereby incorporated herein by reference.

BACKGROUND

The semiconductor industry continues to increase the density of electronic components (e.g., transistors, diodes, resistors, capacitors, etc.) in integrated circuits (ICs) by innovations in semiconductor technology such as, progressive reductions in minimum feature size, three-dimensional (3D) transistor structures (e.g., the fin field-effect transistor (FinFET)), increasing the number of interconnect levels, and non-semiconductor memory, such as ferroelectric random access memory (RAM) or FRAM, and magneto-resistive RAM or MRAM, within the interconnect levels stacked above the semiconductor substrate. The basic storage element of an MRAM is the magnetic-tunnel-junction (MTJ). A high component density enables the System-on-Chip (SoC) concept wherein multiple functional blocks, such as, central processing unit (CPU), cache memory (e.g., static RAM (SRAM)), analog/RF functions, and nonvolatile memory (e.g., Flash, FRAM, and MRAM) are integrated on a single integrated circuit, often referred to as a chip. Integrating such a diversity of functions on one chip often presents new challenges in forming and integrating a concomitantly large variety of electronic components and transistor structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
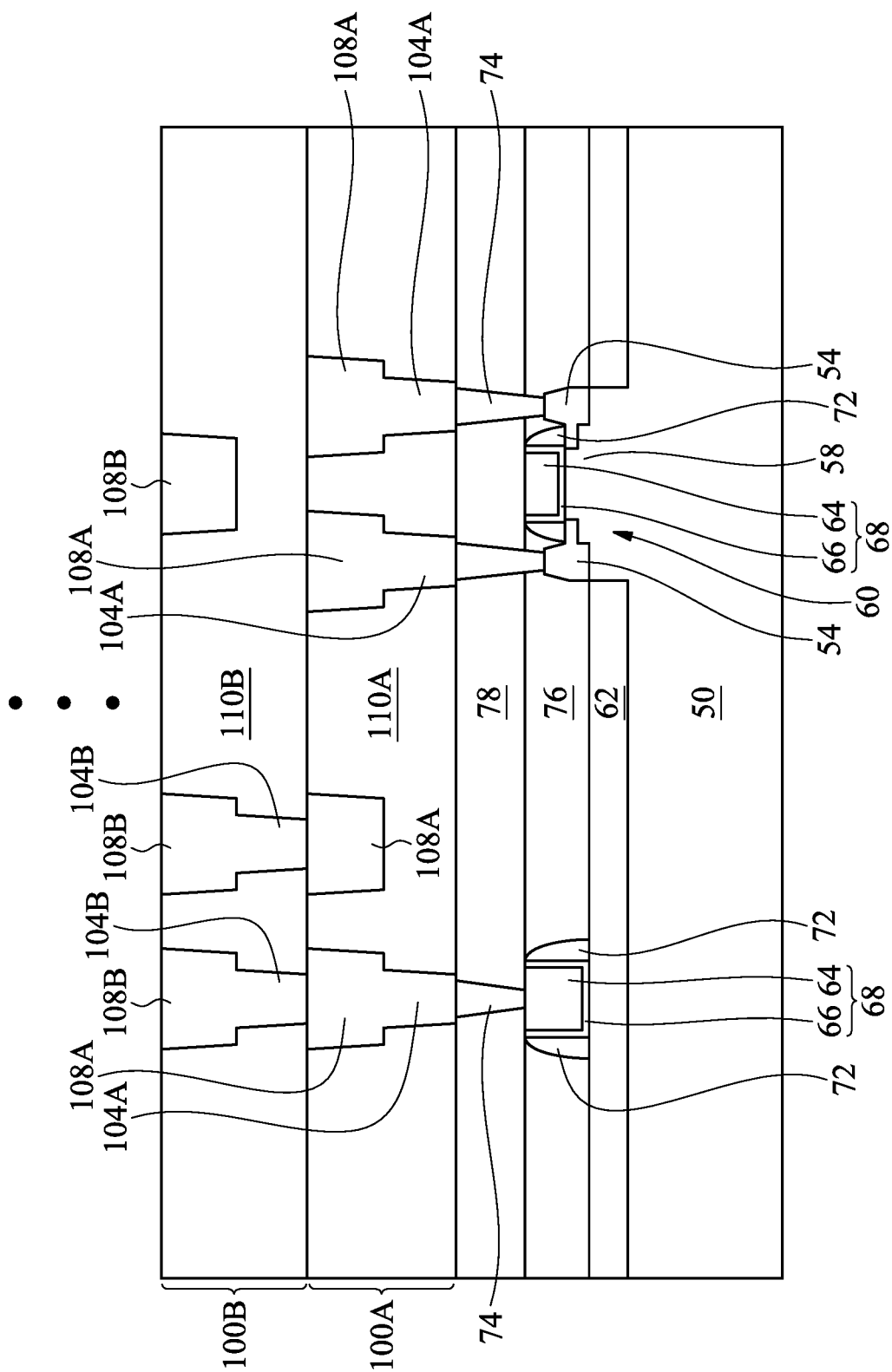
FIG. 1 illustrates a cross-sectional view of a semiconductor substrate and multilevel interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure describes embodiments of methods to form magnetic tunnel junction (MTJ) memory cells in the context of an MRAM array. The MTJ memory cell may be formed within, for example, a multilevel interconnect system comprising conductive interconnect structures of conductive lines, contacts, and vias used to connect electronic devices in an integrated circuit. The conductive interconnect structures may be formed in dielectric layers deposited over a semiconductor substrate in which multiple electronic devices may be formed, such as, fin field effect transistors (FinFETs), metal-oxide-semiconductor (MOS) capacitors, diffusion resistors, and the like, in accordance with some embodiments. These electronic devices may be used as components of integrated electronic circuitry by connecting external electrical power supplies and electrical signals to the electrodes of the electronic devices, and by interconnecting the electronic devices in accordance with the integrated circuit design using the multilevel interconnect system. In some embodiments, additional electronic devices may be formed above the semiconductor substrate. Examples of electronic devices formed above a semiconductor substrate include metal-insulator-metal (MIM) capacitors, thin-film resistors, metal inductors, micro-electro-mechanical system (MEMS) components (e.g., digital mirror devices, infrared bolometer arrays, inkjet printheads, etc.), and the like. Connections to electrodes of electronic devices formed above a substrate may also be established with conductive connectors and lines of the upper levels of the interconnect system.

The present disclosure includes methods of forming, for example, a bottom electrode (BE) of MTJ memory cells of an MRAM array. Embodiments described herein disclose surface preparation processes of the conductive materials used in forming the BE that may reduce an undesirable electrical resistance at the interface between the BE and the respective MTJ memory cell. The BE refers to a conductive element used to electrically contact a lowermost layer of an MTJ which may be a storage element of a cell in an MRAM array. While the present disclosure discusses aspects of methods of forming a conductive element in the context of forming a bottom electrode of an MTJ memory cell, other embodiments may utilize aspects of this disclosure with other electronic devices to, for example, reduce electrical resistance.

FIG. 1 illustrates a cross-sectional view of a semiconductor substrate 50 in which various electronic devices may be formed, and a portion of a multilevel interconnect system (e.g., layers 100A and 100B) formed over the substrate 50, in accordance with some embodiments. Generally, as will be discussed in greater detail below, FIG. 1 illustrates a FinFET device 60 formed on a substrate 50, with multiple interconnection layers formed thereover. As indicated by the ellipsis at the top of FIG. 1, multiple interconnect levels may be similarly stacked in the fabrication process of an integrated circuit.

Generally, the substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as, germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1 is a three-dimensional MOSFET structure formed in fin-like strips of semiconductor protrusions 58 referred to as fins. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a gate-last process flow. In a gate last process flow a sacrificial dummy gate structure (not shown) is formed after forming the STI regions 62. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the HKMG gate structure 68 as illustrated in FIG. 1. The HKMG gate structure 68 illustrated in the right side in FIG. 1 (seen on the top of fin 58) is an example of an active HKMG gate structure which extends, e.g., along sidewalls of and over a the portion of fin 58 protruding above the STI 62, and the HKMG gate structure 68 in the left side in FIG. 1 is an example gate structure extending over the STI region 62, such as between adjacent fins. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1) or the surface of the STI dielectric (as illustrated in the left side of FIG. 1).

Source and drain regions 54 are semiconductor regions in direct contact with the semiconductor fin 58. In some embodiments, the source and drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method (e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source and drain regions 54 either in situ during SEG, or by an ion implantation process performed after the SEG, or by a combination thereof.

A first interlayer dielectric (ILD) 76 (seen in FIG. 1) is deposited to fill the spaces between dummy gate structures (not shown) and between portions of the fins 58 protruding above the STI 62. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD 76. The HKMG gate structures 68, illustrated in FIG. 1, may then be formed by first removing the dummy gate structures using one or more etching techniques, thereby creating recesses between respective spacers 72. Next, a replacement gate dielectric layer 66 comprising one more dielectrics, followed by a replacement conductive gate layer 64 comprising one or more conductive materials, are deposited to completely fill the recesses. Excess portions of the gate structure layers 64 and 66 may be removed from over the top surface of first ILD 76 using, for example a CMP process. The resulting structure, as illustrated in FIG. 1, may be a substantially coplanar surface comprising an exposed top surface of first ILD 76, spacers 72, and remaining portions of the HKMG gate layers 66 and 64 inlaid between respective spacers 72.

A second ILD layer 78 may be deposited over the first ILD layer 76, as illustrated in FIG. 1. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, physical vapor deposition (PVD), ALD, PEALD, PECVD, SACVD, FCVD, spin-on, and/or the like, or a combination thereof.

The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

As illustrated in FIG. 1, electrodes of electronic devices formed in the substrate 50 may be electrically connected to conductive features of a first interconnect level 100A using conductive connectors (e.g., contacts 74) formed through the intervening dielectric layers. In the example illustrated in FIG. 1, the contacts 74 make electrical connections to the source and drain regions 54 of FinFET 60. Contacts 74 to gate electrodes are typically formed over STI regions 62. A separate gate electrode 64 (shown in the left in FIG. 1) illustrates such contacts. The contacts may be formed using photolithography techniques. For example, a patterned mask may be formed over the second ILD 78 and used to etch openings that extend through the second ILD 78 to expose a portion of gate electrodes over STI regions 62, as well as etch openings over the fins 58 that extend further, through the first ILD 76 and the CESL (not shown) liner below first ILD 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the gate electrodes 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL.

In some embodiments, a conductive liner may be formed in the openings in the first ILD layer 76 and the second ILD layer 78. Subsequently, the openings are filled with a conductive fill material. The liner comprises barrier metals used to reduce out-diffusion of conductive materials from the contacts 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD 78. The resulting conductive plugs extend into the first and second ILD layers 76 and 78 and constitute contacts 74 making physical and electrical connections to the electrodes of electronic devices, such as the tri-gate FinFET 60 illustrated in FIG. 1. In this example, contacts to electrodes over STI 62 and to electrodes over fins 58 are formed simultaneously using the same processing steps. However, in other embodiments these two types of contacts may be formed separately.

As illustrated in FIG. 1, multiple interconnect levels may be formed, stacked vertically above the contact plugs 74 formed in the first and second ILD layers 76 and 78, in accordance with a back end of line (BEOL) scheme adopted for the integrated circuit design. In the BEOL scheme illustrated in FIG. 1, various interconnect levels have similar features. However, it is understood that other embodiments may utilize alternate integration schemes wherein the various interconnect levels may use different features. For example, the contacts 74, which are shown as vertical connectors, may be extended to form conductive lines which transport current laterally.

In this disclosure, the $N^{th}$ interconnect level comprises conductive vias, $V_N$, and lines, $M_N$, embedded in an inter-metal dielectric layer, $IMD_N$. In addition to providing insulation between various conductive elements, an IMD layer may include one or more dielectric etch stop layers to control the etching processes that form openings in the IMD layer. Generally, vias, $V_N$, conduct current vertically and are used to electrically connect two conductive features located at vertically adjacent levels, whereas lines, $M_N$, conduct current laterally and are used to distribute electrical signals and power within one level. In the BEOL scheme illustrated in FIG. 1, conductive vias $V_1$ 104A connect contacts 74 to conductive $M_1$ lines 108A and, at subsequent levels, vias $V_N$ connect $M_{N-1}$ lines to $M_N$ lines (e.g., a pair of lines 108A and 108B can be connected by via 104B). Other embodiments may adopt a different scheme. For example, vias $V_1$ may be omitted from the $M_1$ level and the contacts 74 may be configured to be directly connected to $M_1$ lines 108A.

Still referring to FIG. 1, the first interconnect level 100A may be formed using, for example, a dual damascene process flow. First, a dielectric stack used to form $IMD_1$ layer 110A may be deposited using one or more layers of the dielectric materials listed in the description of the first and second ILD layers 76 and 78. In some embodiments, $IMD_1$ layer 110A includes an etch stop layer (not shown) positioned at the bottom of the dielectric stack. The etch stop layer comprises one or more insulator layers (e.g., SiN, SiC, SiCN, SiCO, CN, combinations thereof, or the like) having an etch rate different than an etch rate of an overlying material. The techniques used to deposit the dielectric stack for $IMD_1$ may be the same as those used in forming the first and second ILD layers 76 and 78.

Appropriate photolithography and etching techniques (e.g., anisotropic RIE employing fluorocarbon chemistry) may be used to pattern the $IMD_1$ layer 110A to form openings for vias and lines. The openings for vias may be vertical holes extending through $IMD_1$ layer 110A to expose a top conductive surface of contacts 74, and openings for lines may be longitudinal trenches formed in an upper portion of the $IMD_1$ layer. In some embodiments, the method used to pattern holes and trenches in $IMD_1$ 110A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of $IMD_1$ layer 110A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive features $V_1$ 104A and $M_1$ 108A of the first interconnect level 100A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an ECP deposition step that completely fills the openings with a conductive fill material.

The diffusion barrier conductive liner in the $V_1$ vias 104A and $M_1$ lines 108A comprises one or more layers of TaN, Ta, TiN, Ti, Co, or the like, or combinations thereof. The conductive fill layer in $V_1$ 104A and $M_1$ 108A may comprise metals such as Cu, Al, W, Co, Ru, or the like, or combinations thereof, or multi-layers thereof. The conductive materials used in forming the conductive features $V_1$ 104A and $M_1$ 108A may be deposited by any suitable method, for example, CVD, PECVD, PVD, ALD, PEALD, electrochemical plating (ECP), electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the $IMD_1$ 110A outside of the openings may be removed by a planarizing process (e.g., CMP) thereby forming a top surface comprising dielectric regions of $IMD_1$ 110A that are substantially coplanar with conductive regions of $M_1$ 108A. The planarization step completes fabrication of the first interconnect level 100A comprising conductive vias $V_1$ 104A and conductive lines $M_1$ 108A embedded in $IMD_1$ 110A, as illustrated in FIG. 1.

The interconnect level positioned vertically above the first interconnect level 100A in FIG. 1, is the second interconnect level 100B. In some embodiments, the structures of the various interconnect levels (e.g., the first interconnect level 100A and the second interconnect level 100B) may be similar. In the example illustrated in FIG. 1, the second interconnect level 100B comprises conductive vias $V_2$ 104B and conductive lines $M_2$ 108B embedded in an insulating film $IMD_2$ 110B having a planar top surface. The materials and processing techniques described above in the context of the first interconnect level 100A may be used to form the second interconnect level 100B and subsequent interconnect levels.

Although an example electronic device (FinFET 60) and example interconnect structures making connections to the electronic device are described, it is understood that one of ordinary skill in the art will appreciate that the above examples are provided for illustrative purposes only to further explain applications of the present invention, and are not meant to limit the present invention in any manner.

Figure 2:
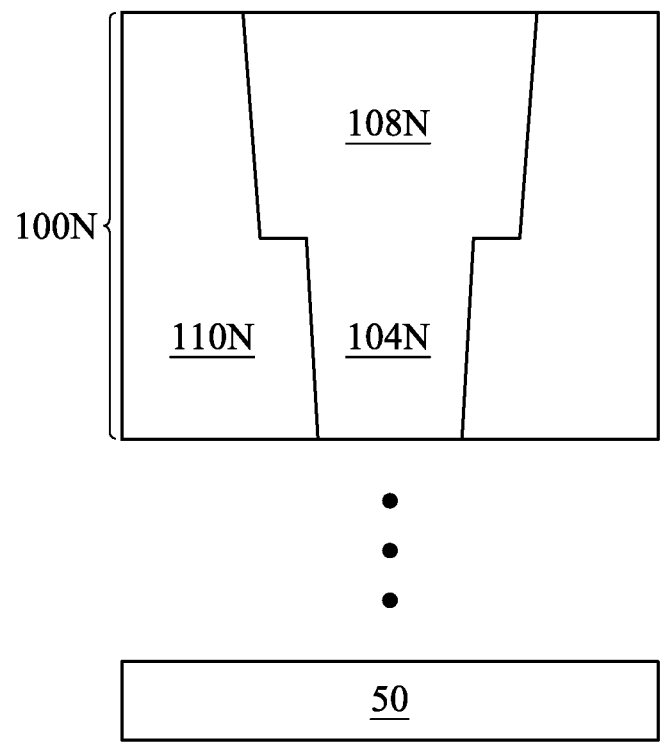
FIGS. 2 through 11 illustrate cross-sectional views of an MRAM cell using an MTJ storage element at various intermediate stages of fabrication, in accordance with some embodiments.

FIG. 2 illustrates a cross-sectional view of an $N^{th}$ interconnect level 100N at an initial stage of fabrication of the MRAM array. In FIG. 2, a conductive line $M_N$ 108N at the $N^{th}$ interconnect level 100N has been illustrated as the conductive feature to which a bottom electrode (BE) of an MTJ memory cell will be electrically coupled at a subsequent processing step, in accordance with some embodiments. The conductive line $M_N$ 108N is shown for illustrative purposes only; it is understood that the conductive line $M_N$ 108N may be placed at any metallization layer suitable in a particular design. In FIG. 2, a via $V_N$ 104N and a conductive line $M_N$ 108N are shown embedded in an insulating film $IMD_N$ 110N. The top dielectric surface of $IMD_N$ 110N is shown to be substantially coplanar with the top conductive surface of conductive line $M_N$ 108N, within process variations. In this example, the $N^{th}$ interconnect level 100N may be formed using the same materials and methods that were described with reference to FIG. 1 to form the first and second interconnect levels 100A and 100B. The ellipsis in FIG. 2 indicates collectively the lower interconnect levels that may be used to electrically connect to electronic devices formed within and/or over the semiconductor substrate 50, such as the FinFET device 60 in FIG. 1. Subsequent figures do not illustrate the substrate 50 and the ellipsis indicative of interconnect levels below the $N^{th}$ interconnect level 100N.

Figure 3:
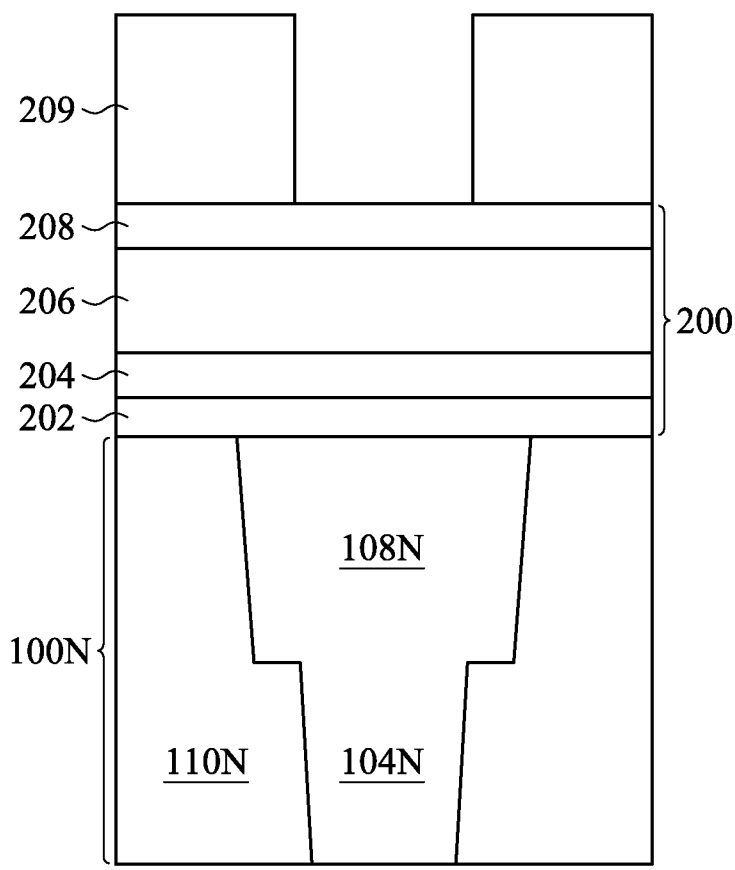

FIG. 3 illustrates a dielectric stack 200 comprising one or more dielectric layers formed successively over the $N^{th}$ interconnect level 100N in accordance with some embodiments. In some embodiments, the dielectric stack 200 may be positioned between a subsequently formed MRAM cell and the conductive line $M_N$ 108N. A first dielectric layer 202 may be formed over the planarized top surface of the $N^{th}$ interconnect level 100N, and a second dielectric layer 204 formed over first dielectric layer 202. In the example structure illustrated in FIG. 3, the first and second dielectric layers 202 and 204 may be used collectively as an etch stop layer during a subsequent etching step used to form vertical holes extending through the dielectric stack 200. In some embodiments, the first and second dielectric layers 202 and 204 comprise AlN and $AlO_x$, respectively, although other dielectric materials (e.g., SiN, SiC, and/or the like, or a combination thereof) may be used. In some embodiments, the first dielectric layer 202 may have a thickness from about 10 Å to about 1000 Å, and the second dielectric layer 204 may have a thickness from about 10 Å to about 1000 Å.

Still referring to FIG. 3, a third dielectric layer 206, formed over the second dielectric layer 204, provides insulation between conductive line $M_N$ 108N and the subsequently formed BE of an MTJ memory cell of an MRAM array. In this example, the third dielectric layer 206 may comprise a silicon oxide deposited using, for example, a CVD technique with tetraethyl orthosilicate (TEOS) as a precursor. Other embodiments may use other insulators, for example, PSG, BSG, BPSG, USG, FSG, SiOCH, CDO, flowable oxide, or porous oxides (e.g., xerogels/aerogels), or the like, or a combination thereof. In some embodiments, the third dielectric layer 206 may have a thickness from about 50 Å to about 1000 Å.

FIG. 3 further illustrates an anti-reflective coating (ARC) 208 overlying the third dielectric layer 206 of the example dielectric stack 200, and a patterned photoresist layer 209 overlying the ARC 208. Anti-reflective coatings improve photo resolution by reducing optical distortions associated with specular reflections, thin-film interference, and/or standing waves that may inhibit sharp feature definition during imaging of photoresist material. In the illustrated example, the ARC 208 may comprise a nitrogen-free ARC (NFARC) (e.g., an organic ARC, such as $C_xH_xO_x$, or inorganic ARC, such as SiC) to further improve feature definition during patterning of photoresist layer 209. In some embodiments, the ARC 208 may have a thickness from about 50 Å to about 1000 Å. The various dielectric layers of dielectric stack 200 may be formed by any suitable deposition technique, e.g., CVD, PECVD, ALD, PEALD, PVD, spin-on and/or the like, or a combination thereof. The structure of the dielectric stack 200 is provided as example only; other insulating structures may be utilized.

Figure 4:
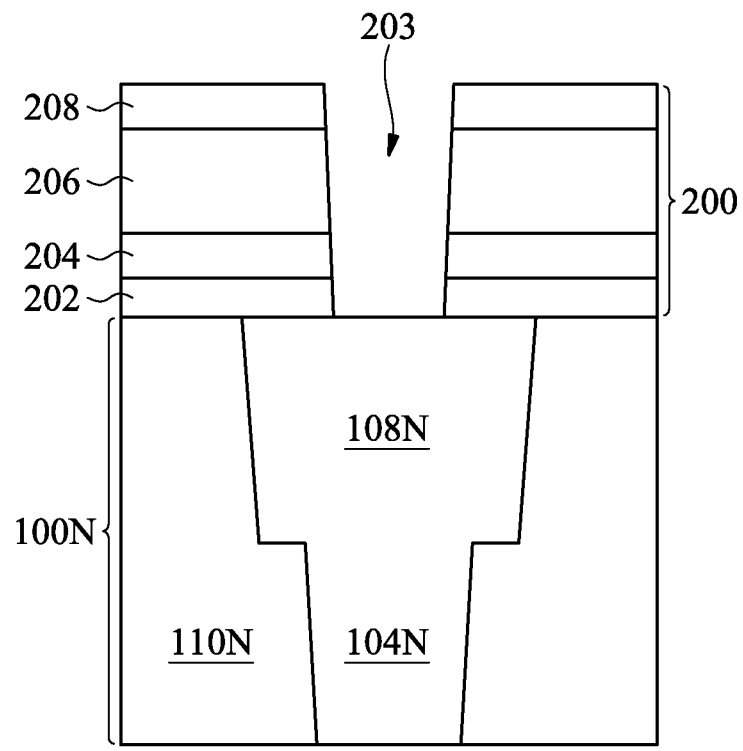

FIG. 4 illustrates a hole 203 extending through the dielectric stack 200 to expose a portion of the conductive top surface of the conductive line $M_N$ 108N inlaid in the insulating film $IMD_N$ 110N. The dielectric stack 200 may be patterned using the patterned photoresist layer 209 as an etch mask to etch holes 203. Any acceptable etching technique may be used, for example, RIE processes described earlier with reference to FIG. 1 used to form vias and lines such as the via $V_N$ 104N and the conductive line $M_N$ 108N. The etching process may include one or more etching steps, for example, a first etch step may be performed using etchants to remove an exposed portion of the ARC layer 208, a second etch step may be performed using etchants that remove the third dielectric layer 206 but leave the first and second dielectric layers 202 and 204 positioned below the third dielectric layer 206 relatively unetched. A third etch step may remove an exposed portion of the first and second dielectric layers 202 and 204 and expose a portion of the top conductive surface of conductive line $M_N$ 108N, as illustrated in FIG. 4. In some embodiments, the first and second etch steps may be the same step.

Figure 5:
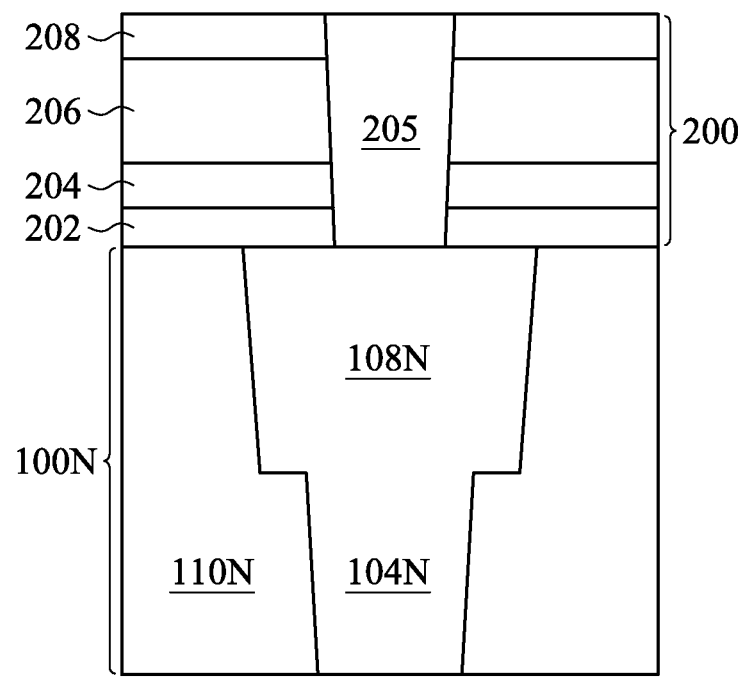

FIG. 5 illustrates a BE via 205 formed in the dielectric stack 200 and electrically connected to conductive line $M_N$ 108N. The BE via 205 may comprise one or more layers. For example, the hole 203 (see FIG. 4) may be filled with a conductive diffusion barrier liner and a conductive fill material filling the hole 203. A planarizing process (e.g., CMP) may be performed to remove excess conductive material from over the top surface of the dielectric stack 200 to form a dielectric surface that is substantially coplanar with the top conductive surface of the BE via 205, as illustrated in FIG. 5.

In some embodiments, (including the example illustrated in FIG. 5) the materials and processing techniques used to form the BE via 205 may be the same as those used to form vias at the interconnect levels described above (e.g., $V_1$ 104A, $V_2$ 104B, and $V_N$ 104N). In other embodiments, the conductive materials and processes used to form BE via 205 may be different from the conductive materials and processes used to form the conductive features of the interconnect levels formed in prior, or subsequent, processing steps. For example, Cu may be used as the conductive fill material in $V_1$ 104A through $V_N$ 104N, while Co may be used as the conductive fill material in BE via 205.

Figure 6:
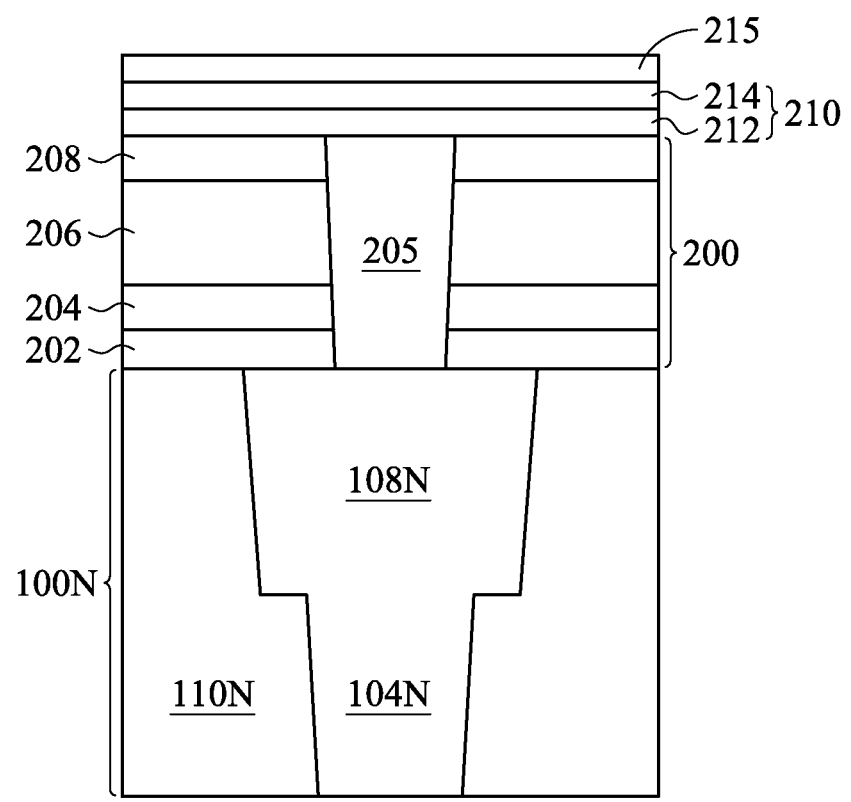

FIG. 6 illustrates a conductive BE layer 210 formed vertically adjacent to the top surface of the BE via 205 and the dielectric stack 200. In some embodiments, the BE layer 210 comprises multiple layers of conductive materials deposited successively, as illustrated in FIG. 6. For example, a first conductive layer 212 comprising, for example, TaN may be formed on the top surface of the dielectric stack 200 and the BE via 205. A second conductive layer 214 comprising, for example, TiN may be formed over the first conductive layer 212, in accordance with some embodiments. In other embodiments, the BE layer 210 may include either more or less than two conductive layers, and may use other conductive materials (e.g., Cu, Al, Ta, W, Ti, or the like). The first and second conductive layers 212 and 214 may be deposited using any suitable technique, such as, CVD, ALD, PECVD, PEALD, or PVD, or the like, or a combination thereof. In some embodiments, the first conductive layer 212 may have a thickness from about 10 Å to about 500 Å, and the second conductive layer 214 may have a thickness from about 10 Å to about 500 Å. The top surface of BE layer 210 may be planarized using, for example, a CMP process, in accordance with some embodiments.

FIG. 6 also illustrates a native oxide film 215 formed on the top surface of the conductive BE layer 210. During processing, the top surface of BE layer 210 may be exposed to oxygen (e.g., the $O_2$ present in air), thereby forming a native oxide film. As used herein, at least in some instances, the native oxide film refers to an oxide film or an oxide-containing film that is not intentionally formed on the top surface of the conductive BE layer 210. In the example illustrated in FIG. 6 and in embodiments in which the top conductive layer 214 comprises TiN, and when exposed to oxygen, a thin native oxide film 215 containing oxides and oxynitrides of Ti (e.g., $TiO_2$ and $TiO_xN_y$) may be formed. Generally, native oxide films of metals, such as native oxide film 215, are poor conductors, hence, obstruct conduction of electric current. In the example illustrated in FIG. 6, a magnetic tunnel junction (MTJ) subsequently formed over the BE 210 may be the storage element of the MRAM cell. The native oxide film 215 may cause the MRAM circuitry to fail to force sufficient current through the MTJ to reverse a magnetic field within the MTJ during electrical operation and, thereby, fail to write data accurately into the MRAM cell. The embodiments described herein, discloses methods to eliminate and/or reduce the native oxide film 215 to reduce electrical failures in the functioning of MRAM cell that are subsequently formed over the BE layer 210.

Figure 7:
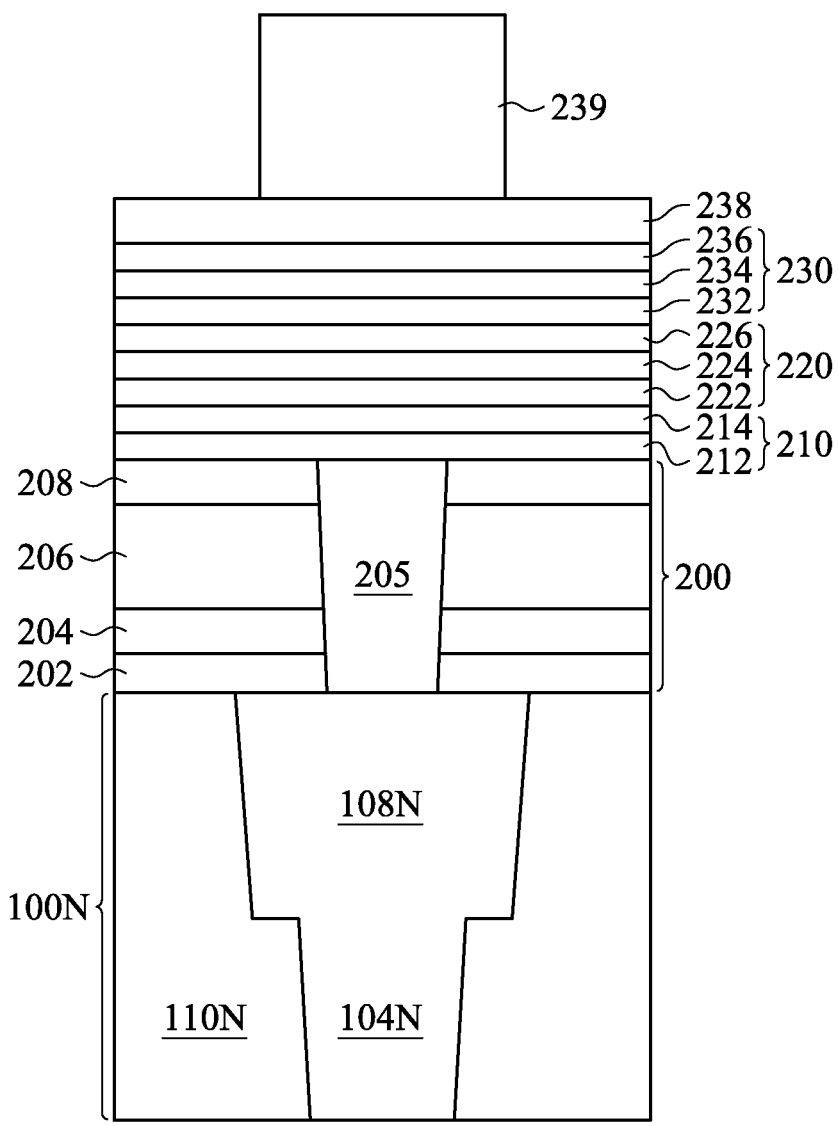

In FIG. 7 the native oxide film 215 (see FIG. 6) may be removed during a surface cleaning pre-treatment process performed prior to depositing a plurality of conductive and dielectric layers used in forming an MTJ, collectively referred to as MTJ layer 220. The multilayered MTJ layer 220 may be formed over the BE layer 210 without exposing the surface of the BE layer 210 to oxygen-containing environment. FIG. 7 illustrates a top electrode (TE) layer 230 comprising several conductive layers formed over MTJ layer 220. The multilayered MTJ layer 220 in FIG. 7 is vertically interposed between the BE layer 210 and the TE layer 230, and both physically and electrically in contact with the BE layer 210 and TE layer 230 at their respective interfaces. FIG. 7 also illustrates a hard mask layer 238 deposited on top of the TE layer 230, and a photoresist layer 239 coated and patterned over the hard mask layer 238 using acceptable photolithography techniques.

In some embodiments, the native oxide film 215 may be removed utilizing a reactive plasma surface cleaning process. Generally, an active chemical species may be generated remotely in a plasma reactor and then directed toward the surface of the substrate where the active reactants may chemically react with the material targeted to be removed from the surface of the substrate, (e.g., the native oxide film 215 in FIG. 6). Undesirable byproducts of this reaction may be removed either physically or chemically.

In some embodiments, the active species generated in the remote plasma reactor are reducing agents (e.g., hydrogen radicals (H*)). The plasma may be generated using, for example, a carrier gas (e.g., Ar, $N_2$, or the like) at a flow rate of about 10 sccm to about 10000 sccm, a process gas (e.g., $H_2$, $NH_3$, or the like) at a flow rate of about 10 sccm to about 10000 sccm, at a pressure of about 1 mTorr to about 10 Torr, a temperature of about 20° C. to about 500° C., a DC bias of about 0.1 kV to about 30 kV, and an RF power of about 100 W to about 2 kW at an excitation frequency of about 13 MHz to about 40 MHz may be used to generate H*. In an example process, H* may be generated in the remote plasma reactor wherein a plasma is generated using a carrier gas Ar at a flow rate 1000 sccm, a process gas $H_2$ at a flow rate 300 sccm, at a pressure 100 mTorr, a temperature 25° C., a DC bias of 3 kV, and an RF power of 300 W at an excitation frequency of 13 MHz.

The H* generated in the remote plasma discussed above are directed from the plasma chamber to the wafer where the H* reacts with the native oxide film 215 (shown in FIG. 6). An example reaction to remove or reduce $TiO_2$ in the native oxide layer film 215 may be described by the following chemical equation: $TiO_2 + 4H^* \rightarrow Ti + 2H_2O$ (g) at a pressure of about 1 mTorr to about 500 mTorr and a temperature of about 20° C. to about 500° C. for a time period of about 20 seconds to about 500 seconds. An example reaction to remove or reduce the $TiO_xN_y$ in the native oxide film 215 may be described by the following chemical equation: $TiO_xN_y + H^* \rightarrow TiN + H_2O$ (g) at a pressure of about 1 mTorr to about 500 mTorr and a temperature of about 20° C. to about 500° C. for a time period of about 20 seconds to about 500 seconds. These reactions may be used to reduce the native oxide film 215 to restore the conductive surface of the second conductive layer 214 and produce a byproduct of $H_2O$ in the form of steam. The process conditions may be varied, depending upon the materials and the conditions. For example, if a thicker oxide layer is present, then it may be desirable to perform the process for a longer period of time. Other chemicals and chemical reactions may also be used for substantial reduction/removal of a surface oxide layer.

In some embodiments, in addition to reducing agents (e.g., H*), the remote plasma may include ions (e.g., $N_2$, $NH_3$, and Ar). These ions may be energized and directed towards the native oxide layer 215 and may physically remove a portion of the native oxide material. A surface cleaning process wherein material is physically removed by energetic ions impinging upon a surface is referred to as sputter cleaning. Reactive plasma cleaning using chemical reactions with reducing agents (e.g., H*) and sputter cleaning using energetic ions (e.g., $N_2$, $NH_3$, and Ar) may be occurring simultaneously during the surface cleaning pre-treatment process step used to remove or reduce the native oxide layer 215.

In other embodiments, the surface cleaning pre-treatment process step used to remove or reduce the native oxide layer 215 may be sputter cleaning process wherein the energetic ions used (e.g., $N_2$, $NH_3$, and Ar) may be generated in a remote plasma. The plasma may be generated using, for example, a carrier gas (e.g., Ar, $N_2$, or the like) at a flow rate of about 10 sccm to about 10000 sccm, a process gas (e.g., $H_2$, $NH_3$, or the like) at a flow rate of about 10 sccm to about 10000 sccm, at a pressure of about 1 mTorr to about 10 Torr, a temperature of about 20° C. to about 500° C., a DC bias of about 10 volts to 3 kV, and an RF power of about 100 W to about 2 kW at an excitation frequency of about 13 MHz to about 40 MHz may be used to generate the energetic ions. In an example process, the energetic ions may be generated in the remote plasma reactor wherein a plasma is generated using a carrier gas Ar at a flow rate 3000 sccm, a process gas $NH_3$ at a flow rate 300 sccm, at a pressure 100 mTorr, a temperature 25° C., a DC bias of 3 kV, and an RF power of 30 W at an excitation frequency of 26 MHz.

In some embodiments, a thermal treatment with gaseous reducing agents such as $H_2$ and $NH_3$ may be used to remove or reduce the native oxide layer 215. An example reaction to remove or reduce the $TiO_2$ that may be present in the native oxide film 215 may be described by the following chemical equation if $H_2$ is used as the reducing agent: $TiO_2 + 2H_2 \rightarrow Ti +$ $2H_2O$ (g) at a pressure of about 1 mTorr to about 500 mTorr and a temperature of about 20° C. to about 500° C. for a time period of about 5 seconds to about 500 seconds. An example reaction to remove or reduce the $TiO_xN_y$ that may be present in the native oxide film 215 may be described by the following chemical equation if $H_2$ is used as the reducing agent: and $TiO_xN_y+H_2\rightarrow TiN+H_2O$ (g) at a pressure of about 1 mTorr to about 500 mTorr and a temperature of about 20° C. to about 500° C. for a time period of about 5 seconds to about 500 seconds. An example reaction to remove or reduce the $TiO_2$ that may be present in the native oxide film 215 may be described by the following chemical equation if $NH_3$ is used as the reducing agent: $3TiO_2+4NH_3\rightarrow 3Ti+6H_2O$ (g)+$2N_2$ at a pressure of about 100 mTorr to about 500 mTorr and a temperature of about 20° C. to about 500° C. for a time period of about 10 seconds to about 1000 seconds. An example reaction to remove or reduce a $TiO_xN_y$ that may be present in the native oxide film 215 may be described by the following chemical equation if $NH_3$ is used as the reducing agent: $TiO_xN_y+NH_3\rightarrow TiN+H_2O$ (g) at a pressure of about 100 mTorr to about 500 mTorr and a temperature of about 20° C. to about 500° C. for a time period of about 10 seconds to about 1000 seconds. These reactions may be used to remove or reduce the native oxide film 215.

In FIG. 7, the multilayered MTJ layer 220 formed over the BE layer 210 may include various layers formed of different combinations of materials. In an example embodiment, MTJ layer 220 includes a pinning layer 222, a tunnel barrier layer 224, and a free layer 226, formed successively. In an example embodiment, the pinning layer 222 is formed of PtMn, the tunnel barrier layer 224 is formed of MgO over the pinning layer 222, and a free layer 226 is formed of $Co_xFe_yB_{1-x-y}$ alloy over the MgO tunnel barrier layer 224. In some embodiments, MTJ layer 220 may use other materials, such as, alloys of Mn with a metal other than Pt (e.g., IrMn, RhMn, NiMn, PdPtMn, or FeMn) to form a pinning layer 222, other dielectrics (e.g., $AlO_x$) to form a tunnel barrier layer 224, and $Fe_yB_{1-x}$ alloy to form the free layer 226. In addition, MTJ layer 220 may have other variations including other layers, such as anti-ferromagnetic layers (e.g., a multilayered $[Co/Pt]_n$ synthetic anti-ferromagnetic (SyAF) layer, etc.). The materials for the MTJ layer 220 may be deposited using one or more techniques, such as, CVD, PECVD, PVD, ALD, or PEALD, or the like, or a combination thereof. In some embodiments, the tunnel barrier layer 224 may be formed by depositing a metal and then oxidizing the metal to convert the metal to a dielectric using, for example, a plasma oxidation technique. It should be recognized that the MTJ layer 220 may have many variations, which are also within the scope of the present disclosure.

Still referring to FIG. 7, the TE layer 230 may be formed over the multilayered MTJ layer 220. The bottom conductive surface of the TE layer 230 is shown physically and electrically in contact with the top conductive free layer 226 of the MTJ layer 220. The example TE layer 230 in FIG. 7 comprises three conductive material layers: a first conductive layer 232 comprising TiN, a second conductive layer 234 comprising Ta, and a third conductive layer 236 comprising TaN formed sequentially, in accordance with some embodiments. In other embodiments, the TE layer 230 may include a different number of conductive layers, and may use other conductive materials (e.g., Cu, Al, W, Ti, or the like). The hard mask layer 238, illustrated in FIG. 7, may comprise a dielectric material, in accordance with some embodiments. For example, the hard mask layer 238 may be silicon carbide (SiC), silicon oxynitride (SiON), silicon nitride (SiN), silicon dioxide ($SiO_2$), the like, and/or a combination thereof. The conductive layers 232, 234, 236, and the hard mask layer 238 may be deposited using any suitable technique, such as, CVD, PECVD, ALD, PEALD, or PVD, or the like, or a combination thereof.

Figure 8:
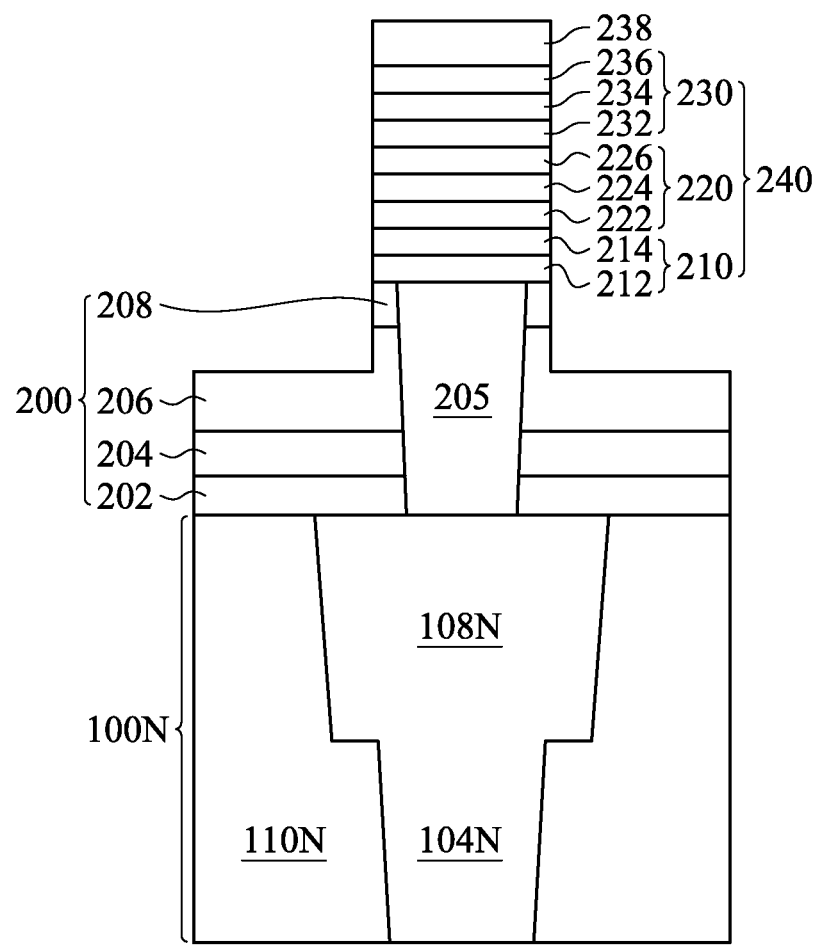

Referring now to FIG. 8, a suitable anisotropic etch (e.g., RIE) may be used to pattern the hard mask layer 238 using the patterned photoresist layer 239 (shown in FIG. 7) as an etch mask, and that pattern may be transferred to form the TE 230, the MTJ 220, and the BE 210 as illustrated in FIG. 8 using the patterned hard mask layer 238 as an etch mask. In addition, the etch process may remove the ARC 208 from the regions unprotected by the patterned hard mask layer 238 and recess the third dielectric layer 206 of the dielectric stack 200. Any remaining photoresist material may be removed by performing a surface clean process (e.g., an ashing process using oxygen plasma).

Figure 9:
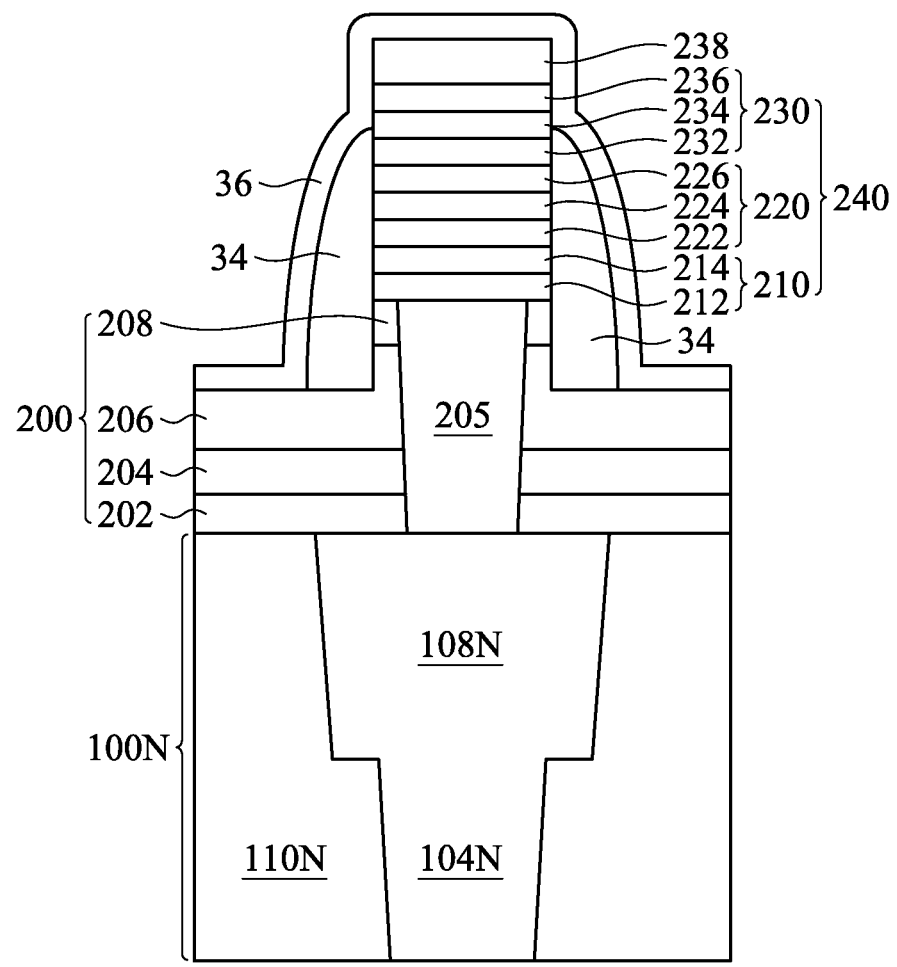

In FIG. 9, dielectric spacers 34 are shown on the vertical sidewalls of the structure illustrated in FIG. 8 supported from below by the recessed horizontal surface of the third dielectric layer 206 of the dielectric stack 200. The dielectric material used in dielectric spacers 34 may be silicon oxide, silicon nitride, or another suitable dielectric deposited by acceptable deposition techniques, such as CVD, PECVD, ALD, PEALD, PVD, the like, and/or a combination thereof, and etched by an appropriate anisotropic etching technique (e.g., RIE). In some embodiments, the etching process may form the dielectric spacers 34 recessed at the top thereby exposing the sides of the hard mask layer 238 and a portion of the TE 230. FIG. 9 also illustrates a protective dielectric cover layer 36 formed over the surface, in accordance with some embodiments. The protective dielectric cover layer 36 may be formed using dielectric materials similar to those used to form spacers 34. In some embodiments, the protective dielectric cover layer 36 may have a thickness from about 10 Å to about 3000 Å. The BE 210, the TE 230, and the MTJ 220 are collectively referred to as an MRAM cell 240.

Figure 10:
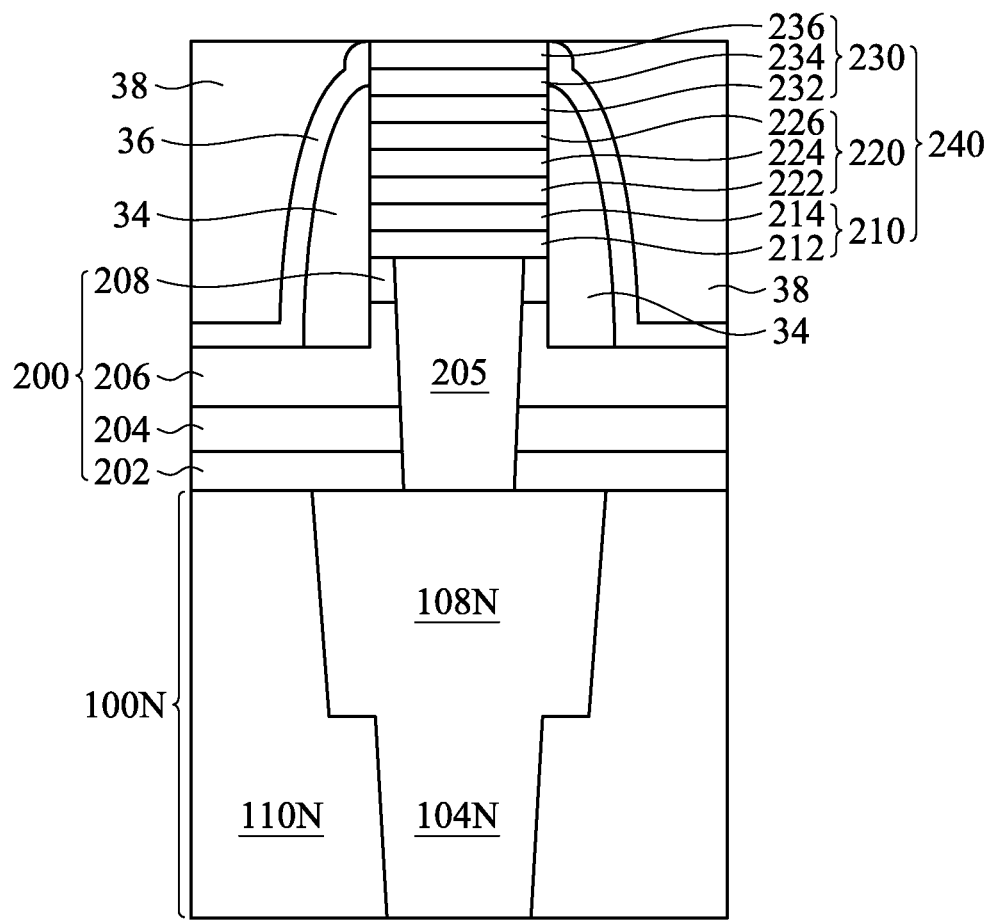

FIG. 10 illustrates a MRAM fill layer 38 formed adjacent to the MRAM cell 240 and filling the space in between memory cells. The MRAM fill layer 38 may be formed by depositing a dielectric material over the protective dielectric cover layer 36 and performing a suitable planarizing process (e.g., CMP) to remove excess materials. In some embodiments, the planarizing process removes all dielectric materials present over the TE 230, including a portion of protective dielectric cover layer 36 and the remaining the hard mask 238 covering the TE 230. The planarizing process may be completed once a top conductive surface of the topmost conductive layer 236 of TE 230 is exposed. As illustrated in FIG. 10, after the planarizing process, a top surface is formed having a dielectric portion substantially coplanar with a conductive portion. The MRAM fill layer 38 may use a suitable dielectric material, such as, $SiO_2$, SiON, PSG, BSG, BPSG, USG, or a low-k dielectric (e.g., PSG, BSG, BPSG, USG, FSG, SiOCH, CDO, flowable oxide, or porous oxides (e.g., xerogels/aerogels)), or the like, or a combination thereof. The dielectric MRAM fill layer 38 may be formed using any suitable method, such as CVD, PVD, ALD, PECVD, HDP-CVD, SACVD, FCVD, spin-on, and/or the like, or a combination thereof.

Figure 11:
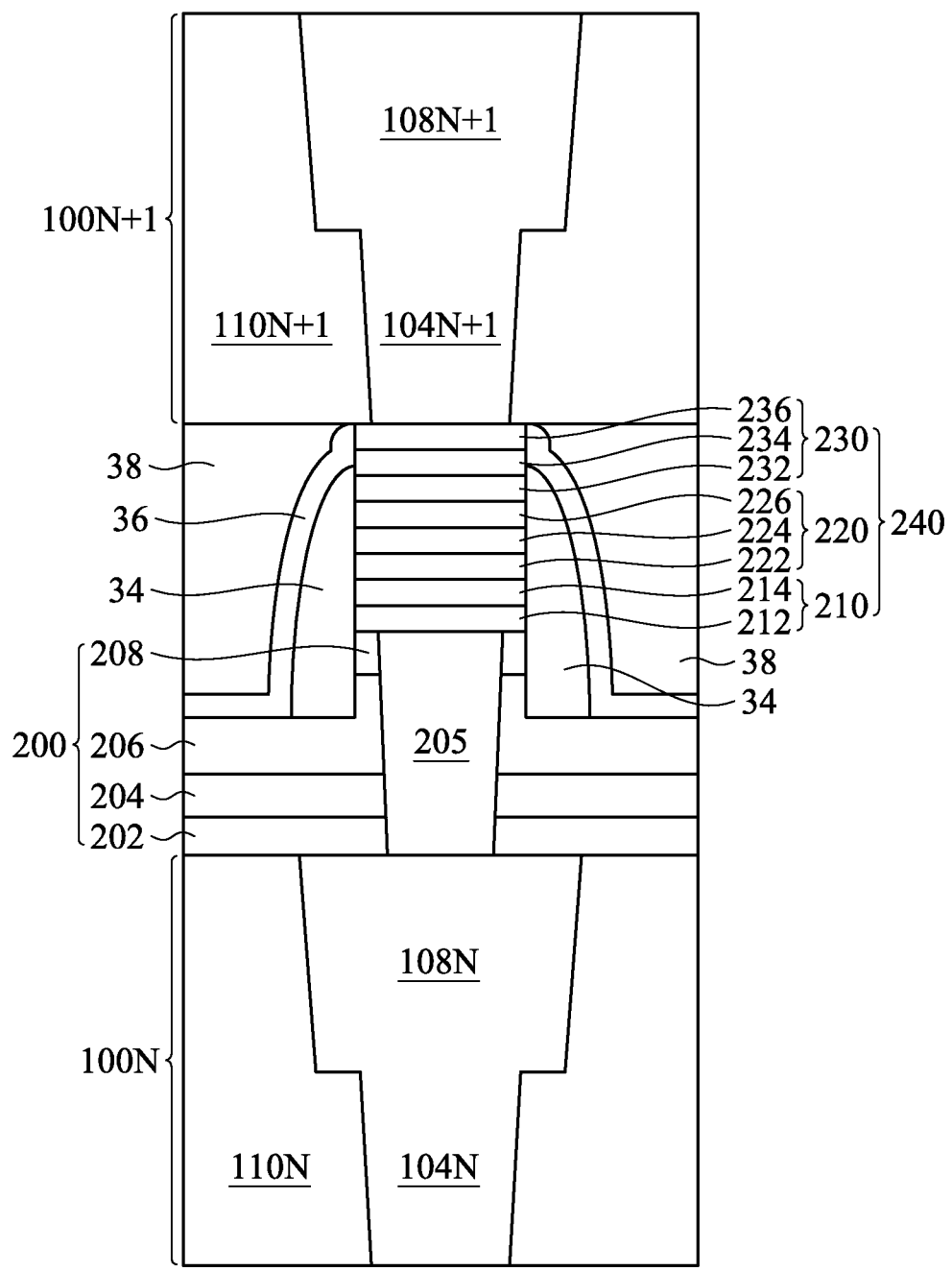

FIG. 11 illustrates a cross-sectional view of the first interconnect level positioned above the MRAM array. In FIG. 11, this level has been specified as the $(N+1)^{th}$ interconnect level 100N+1. In this example, interconnect level 100N+1 may be formed using the same materials and methods that were described to form the lower interconnect level 100N. In FIG. 11, a via $V_{N+1}$ 104N+1 and a line $M_N+1$ 108N+1 are shown embedded in an insulating film $IMD_{N+1}$ 110N+1. The via $V_{N+1}$ 104N+1 may be used to make electrical connection to the top conductive surface of TE 230.

Digital data may be stored in an MTJ memory cell based on the magneto-resistive effect described below. In the embodiments described in this disclosure, the magnetic materials used to form the free layer 226 and the pinned layer 222 have a magnetic moment that may be polarized vertically. The MTJ is programmed electrically by forcing the direction of polarization to be either up or down by utilizing the spin torque transfer (STT) effect. During programming, the magnetic moment of the free layer 226 is adjusted to be either parallel or anti-parallel to the magnetic moment of the pinned layer 222 by appropriately biasing the top electrode 230 and the bottom electrode 210. The parallel configuration corresponds to a high probability for quantum mechanical tunneling of electrons through the tunnel barrier layer 224, while the anti-parallel configuration corresponds to a low tunneling probability. The information stored as the parallel or anti-parallel state is sensed during a read operation by sensing the magnitude of current flowing vertically through the tunnel barrier layer 224 when a cell is probed with a relatively small electrical voltage applied between the top electrode 230 and the bottom electrode 210. A response of a high electrical current (low resistance) indicates a parallel state while a low electrical current (high resistance) indicates an anti-parallel state.

One advantage of the embodiments described in this disclosure is that an MRAM array fabricated using the embodiments may have a reduced probability of read fails that occur when the sensing circuitry fails to sense the parallel state of an MTJ. The occurrence of these read fails is reduced because the processes described in this disclosure eliminate or reduce any unwanted native oxide remaining over the bottom electrode, thereby reducing resistance. Native oxide is an insulating material; hence its presence can cause a read failure by suppressing an expected high electrical current from flowing through the MTJ.

Another advantage of the embodiments described in this disclosure is that an MRAM array fabricated using the embodiments described herein may have a reduced probability of write fails that occur when the programming circuitry fails to force sufficient current through an MTJ to flip the parallel (or anti-parallel) state of the MTJ. Again, the occurrence of these write fails is reduced because the processes described in this disclosure eliminate any unwanted native oxide remaining over the bottom electrode which can limit the amount of electrical current that can be forced through the MTJ during a write operation.

In an embodiment, a method of forming a semiconductor structure includes forming a bottom electrode layer, wherein a dielectric layer overlies the bottom electrode layer; performing a treatment to reduce the dielectric layer on the bottom electrode layer; after performing the treatment, forming a magnetic tunnel junction (MTJ) layer over the bottom electrode layer; forming a top electrode layer over the MTJ layer; and patterning the top electrode layer, the MTJ layer, and the bottom electrode layer to form a magnetic random access memory (MRAM) cell. In an embodiment, the treatment generates a gaseous by-product including steam. In an embodiment, the method further includes forming the dielectric layer by exposing the bottom electrode layer to an oxygen-containing environment. In an embodiment, the dielectric layer includes $TiO_xN_y$ or $TiO_2$. In an embodiment, the treatment includes exposing the dielectric layer to hydrogen radicals. In an embodiment, the hydrogen radicals are produced in a remote plasma process. In an embodiment, the treatment includes a thermal treatment using $H_2$ as a reducing agent. In an embodiment, the treatment includes a thermal treatment using $NH_3$ as a reducing agent.

In an embodiment, a method of forming a semiconductor structure includes forming a bottom electrode via in a dielectric stack, the dielectric stack includes a first dielectric layer over a second dielectric layer; forming a bottom electrode layer over the bottom electrode via and the dielectric stack; reducing a dielectric layer on a surface of the bottom electrode layer, wherein reducing the dielectric layer produces a gaseous by-product; after reducing the dielectric layer, forming a magnetic tunnel junction (MTJ) layer over the bottom electrode layer; forming a top electrode layer over the MTJ layer; and after forming the top electrode layer, patterning the top electrode layer, the MTJ layer, and the bottom electrode layer to form a magnetic random access memory (MRAM) cell. In an embodiment, the dielectric layer is formed on the surface of the bottom electrode layer when the bottom electrode layer is exposed to an oxygen containing environment prior to the reducing the dielectric layer. In an embodiment, the reducing includes a generating H* using a plasma process using a carrier gas of Ar or $N_2$ at a flow rate of about 10 sccm to about 10000 sccm, a process gas of $H_2$ or $NH_3$ at a flow rate of about 10 sccm to about 10000 sccm, at a pressure of about 1 mTorr to about 10 Torr, a temperature of about 20° C. to about 500° C., a DC bias of about 0.1 kV to about 30 kV, and an RF power of about 100 W to about 2 kW at an excitation frequency of about 13 MHz to about 40 MHz. In an embodiment, the dielectric layer includes $TiO_2$ and wherein the reducing includes exposing the dielectric layer to H* and generating a by-product of steam. In an embodiment, the dielectric layer includes $TiO_xN_y$ and wherein the reducing includes exposing the dielectric layer to H* and generating a by-product of steam. In an embodiment, the dielectric layer includes $TiO_2$ and wherein the reducing includes using $H_2$ as a reducing agent at a pressure of about 1 mTorr to about 500 mTorr and a temperature of about 20° C. to about 500° C. for a time period of about 5 seconds to about 500 seconds. In an embodiment, the dielectric layer includes $TiO_xN_y$ and wherein the reducing includes using $H_2$ as a reducing agent at a pressure of about 1 mTorr to about 500 mTorr and a temperature of about 20° C. to about 500° C. for a time period of about 5 seconds to about 500 seconds. In an embodiment, the dielectric layer includes $TiO_2$ and wherein the reducing includes using $NH_3$ as a reducing agent at a pressure of about 100 mTorr to about 500 mTorr and a temperature of about 20° C. to about 500° C. for a time period of about 10 seconds to about 1000 seconds. In an embodiment, the dielectric layer includes $TiO_xN_y$ and wherein the reducing includes using $NH_3$ as a reducing agent at a pressure of about 100 mTorr to about 500 mTorr and a temperature of about 20° C. to about 500° C. for a time period of about 10 seconds to about 1000 seconds.

In an embodiment, a method of forming a semiconductor structure, includes forming a bottom electrode via in a dielectric stack, the dielectric stack including a first dielectric layer over a second dielectric layer; forming a bottom electrode layer over the bottom electrode via and the dielectric stack, the bottom electrode layer including a plurality of conductive layers; reducing an oxide layer over the bottom electrode layer, wherein reducing the oxide layer exposes a conductive surface; after reducing the oxide layer, forming a magnetic tunnel junction (MTJ) layer over the bottom electrode layer, wherein the MTJ layer includes a tunnel barrier layer interposed between a pinning layer and a free layer; forming a top electrode layer over the MTJ layer; and after forming the top electrode layer, patterning the top electrode layer, the MTJ layer, and the bottom electrode layer to form a magnetic random access memory (MRAM) cell, wherein patterning includes recessing the dielectric stack. In an embodiment, the oxide layer includes a native oxide layer. In an embodiment, recessing the dielectric stack includes recessing the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, the method comprising:
   forming a bottom electrode via in a dielectric stack;
   forming a bottom electrode layer over the bottom electrode via and the dielectric stack, the bottom electrode layer comprising a plurality of conductive layers;
   reducing an oxide layer over the bottom electrode layer, wherein reducing the oxide layer exposes a conductive surface;
   after reducing the oxide layer, forming a magnetic tunnel junction (MTJ) layer over the bottom electrode layer;
   forming a top electrode layer over the MTJ layer;
   patterning the top electrode layer, the MTJ layer, and the bottom electrode layer to form a magnetic random access memory (MRAM) cell, wherein patterning comprises recessing the dielectric stack;
   forming a dielectric spacer layer over the MRAM cell, the dielectric spacer layer physically contacting a sidewall of the patterned top electrode layer;
   etching the dielectric spacer layer to form dielectric spacers; and
   forming a protective dielectric layer over the MRAM cell, the protective dielectric layer physically contacting the sidewall of the patterned top electrode layer.

2. The method of claim 1, wherein reducing the oxide layer comprises producing a gaseous byproduct.

3. The method of claim 1, wherein etching the dielectric spacer layer comprises exposing a portion of the sidewall of the patterned top electrode layer.

4. The method of claim 1, wherein the MTJ layer comprises a tunnel barrier layer interposed between a pinning layer and a free layer.

5. The method of claim 1, wherein the dielectric stack comprises:
   a silicon oxide layer over an etch stop layer; and
   an anti-reflective coating over the silicon oxide layer.

6. The method of claim 5, wherein recessing the dielectric stack comprises:
   patterning the anti-reflective coating; and
   patterning a portion of the silicon oxide layer.

7. The method of claim 1, wherein the top electrode layer comprises:
   a first conductive layer;
   a second conductive layer over the first conductive layer, the second conductive layer being different from the first conductive layer; and
   a third conductive layer over the second conductive layer, the third conductive layer being different from the first conductive layer and the second conductive layer.

8. The method of claim 7, wherein patterning the top electrode layer comprises patterning the second conductive layer, and wherein the patterned second conductive layer physically contacts the dielectric spacers and the protective dielectric layer.

9. A method, comprising:
   forming a bottom electrode layer over a dielectric stack, wherein a native oxide film forms over a top surface of the bottom electrode layer;
   performing a treatment to chemically reduce the native oxide film;
   after performing the treatment, forming a magnetic tunnel junction (MTJ) layer over the bottom electrode layer;
   forming a top electrode layer over the MTJ layer;
   forming a silicon-containing layer over the top electrode layer;
   patterning the silicon-containing layer, the top electrode layer, the MTJ layer, and the bottom electrode layer;
   after patterning, forming a dielectric spacer layer over and physically contacting the patterned top electrode layer, the patterned MTJ layer, and the patterned bottom electrode layer;
   etching the dielectric spacer layer to form dielectric spacers, the etching exposing a portion of a sidewall of the patterned top electrode layer;
   forming a protective dielectric layer over the dielectric spacers; and
   depositing a dielectric fill layer over the protective dielectric layer.

10. The method of claim 9, wherein before performing the treatment, the top surface of the bottom electrode layer comprises $TiO_xN_y$ or $TiO_2$.

11. The method of claim 10, wherein the treatment comprises a thermal treatment with $H_2$ or $NH_3$.

12. The method of claim 10, wherein the treatment comprises a plasma treatment with hydrogen radicals.

13. The method of claim 9, further comprising forming a bottom electrode via in the dielectric stack, wherein the bottom electrode is formed over the bottom electrode via.

14. The method of claim 9, further comprising planarizing the dielectric fill layer to be level with the protective dielectric layer and the patterned top electrode layer.

15. A method, comprising:
   forming a bottom electrode layer over a dielectric stack, the bottom electrode layer comprising:
   a first metal nitride layer; and
   a second metal nitride layer over the first metal nitride layer, wherein a metal oxide layer is disposed over the second metal nitride layer;
   performing a reduction treatment on the metal oxide layer;
   forming a magnetic tunnel junction (MTJ) layer over the second metal nitride layer;
   forming a top electrode layer over the MTJ layer;
   forming a mask layer over the top electrode layer;
   patterning the mask layer, the top electrode layer, the MTJ layer, the bottom electrode layer, and a portion of the dielectric stack;
   depositing a first dielectric layer along the patterned dielectric stack, the patterned bottom electrode layer, the patterned MTJ layer, the patterned top electrode layer, and the patterned mask layer;

etching the first dielectric layer to form dielectric spacers; and conformally depositing a second dielectric layer along an upper surface of the patterned dielectric stack, the dielectric spacers, a sidewall of the patterned top electrode layer, and the patterned mask layer.

16. The method of claim 15, wherein the top electrode layer comprises:
   a third metal nitride layer over the MTJ layer;
   a metal layer over the first metal nitride layer; and
   a fourth metal nitride layer over the metal layer, and wherein patterning the top electrode layer comprises patterning the third metal nitride layer, the metal layer, and the fourth metal nitride layer.

17. The method of claim 16, wherein etching the first dielectric layer comprises:
   exposing an entirety of a sidewall of the patterned fourth metal nitride layer; and
   exposing a portion of a sidewall of the patterned metal layer.

18. The method of claim 16, wherein a metal of the third metal nitride layer is different from a metal of the fourth metal nitride layer.

19. The method of claim 16, wherein patterning the top electrode layer comprises patterning the metal layer, and wherein the patterned metal layer is in physical contact with the dielectric spacers and the second dielectric layer.

20. The method of claim 15, wherein performing the reduction treatment on the metal oxide layer comprises using at least one of hydrogen or nitrogen.

* * * * *